United States Patent
Hess et al.

(10) Patent No.: US 7,698,511 B2
(45) Date of Patent: Apr. 13, 2010

(54) INTERFACE FOR WRITING TO MEMORIES HAVING DIFFERENT WRITE TIMES

(75) Inventors: Richard F. Hess, Glendale, AZ (US); Kent A. Stange, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 258 days.

(21) Appl. No.: 11/132,860

(22) Filed: May 19, 2005

(65) Prior Publication Data
US 2010/0064092 A1    Mar. 11, 2010

(51) Int. Cl.
G06F 12/00 (2006.01)
G06F 13/00 (2006.01)
G06F 13/28 (2006.01)
G06F 11/00 (2006.01)
G11C 7/10 (2006.01)

(52) U.S. Cl. .................. 711/154; 711/162; 711/100; 711/101; 711/161; 711/167; 714/2; 714/5; 714/6; 365/189.05; 365/189.08

(58) Field of Classification Search .................. None
See application file for complete search history.

(56) References Cited

U.S. PATENT DOCUMENTS

| | | | | |
|---|---|---|---|---|
| 4,751,670 A | | 7/1988 | Hess | 364/900 |
| 4,787,041 A | * | 11/1988 | Yount | 701/3 |
| 4,996,687 A | * | 2/1991 | Hess et al. | 714/15 |
| 5,313,625 A | | 5/1994 | Hess et al. | 395/575 |
| 5,335,234 A | * | 8/1994 | Matteson et al. | 714/767 |
| 5,787,243 A | | 7/1998 | Stiffler | 395/182.11 |
| 5,829,047 A | * | 10/1998 | Jacks et al. | 711/162 |
| 6,163,480 A | * | 12/2000 | Hess et al. | 365/185.08 |
| 6,275,080 B1 | * | 8/2001 | Phan et al. | 327/200 |
| 6,624,677 B1 | * | 9/2003 | Wissel | 327/202 |
| 6,813,527 B2 | | 11/2004 | Hess | 700/82 |
| 2004/0124876 A1 | | 7/2004 | Plants | 326/39 |

FOREIGN PATENT DOCUMENTS

EP    0 363 863 A2    7/1989

OTHER PUBLICATIONS

Search Report for 06114186.7-2210 dated May 13, 2008.
European Examination Report, from corresponding EP Application No. EP 06 114 186, mailed Jan. 28, 2010, 3 pages.

* cited by examiner

Primary Examiner—Sanjiv Shah
Assistant Examiner—Marwan Ayash
(74) Attorney, Agent, or Firm—Shumaker & Sieffert, P.A.

(57) ABSTRACT

An interface between memories having different write times is described. The interface includes a latch for capturing address and data information during a memory access by a processor of a first memory device. The interface also includes an index counter for providing frame management. The interface also includes a variable identity array logic for determining what data is to be written into a second memory device and address generation logic to determine where the data is to be stored in the second memory device. Additionally, the interface includes data validity logic to ensure that the data being written into the second memory device is valid. As a result, the processor can operate in substantially real time and can restore itself after detecting an event upset using the data stored in the second memory device.

24 Claims, 9 Drawing Sheets

INTERFACE FOR WRITING TO MEMORIES HAVING DIFFERENT WRITE TIMES

FIELD

The present invention relates generally to digital computer systems, and more particularly, relates to an interface for memories having different write times.

BACKGROUND

Digital computers are used in many applications, including banking, industrial control processes, and other business systems. The digital computer is also used for controlling vehicles, such as aircraft, spacecraft, boats, and land vehicles. For example, automatic flight control systems for commercial and military aircraft use digital computers. In many applications, computations performed by these digital computers need to be performed in substantially "real time."

Digital computers may include numerous discrete semiconductor or integrated circuit bi-stable elements, generally referred to as latches. A latch is an electronic device that can switch between two stable states in response to low amplitude, high speed signals. Latches are utilized to construct much of the internal hardware of a digital computer, such as logic arrays, memories, registers, control circuits, counters, arithmetic and logic units, and so on.

Digital computers are subject to disturbances that may upset the digital circuitry, but not cause permanent physical damage. For instance, digital computers may operate at nanosecond and sub-nanosecond speeds causing rapidly changing electronic signals to flow through the computer circuits. These signals may generate electromagnetic fields, which may couple to circuits in the vicinity of the signals. While these signals can set latches into desired states, they can also set latches into undesired states. An erroneously set latch can compromise the data processed by the computer and, possibly, completely disrupt the data processing flow of the computer. In digital computer based systems, an error mode that does not result from component damage is typically referred to as a digital system upset or a soft fault.

Digital system upset can also result from spurious electromagnetic signals, such as those caused by lightning, which, for example, can be induced onto the internal electrical cables throughout an aircraft. Such transient signals can propagate to internal digital circuitry, setting latches into erroneous states. These transient signals represent a certain amount of energy. The changing state of the latch in this case is the result of a transfer of energy from the lightning induced transient signal to the electrical circuitry of the latch.

In addition to the energy transfer possible with a signal induced by a lightning event, other events can also provide enough energy transfer to change a latch state. For example, the intense fields associated with electromagnetic weapons, such as electromagnetic pulse (EMP) from a nuclear weapon detonation, high power microwave (HPM), or high-energy nuclear/atomic particles (from a variety of sources, e.g., atmospheric neutrons, cosmic radiation, nuclear weapon detonation, etc.), may deposit sufficient energy into bulk semiconductor material of the digital devices to set latches in erroneous states. Static discharges, power surge switching transients, and radar pulses may also produce spurious signals that can induce electrical transients on system lines and data buses, which in turn can propagate to internal digital circuitry, setting latches in erroneous states.

As described above, the nature of the events that can provide enough energy to change a latch state can be deterministic or stochastic. A latch change into an erroneous state due to such events is referred to as an event upset.

When unintended logic state changes occur, the system may not operate as intended. Energy from an event upset may compromise the data stored within the random access memory (RAM) area of the computer. A digital computer is susceptible to complete disruption if an incorrect result is stored in any of the memory elements associated with the digital computer. Safety-critical digital avionic computer applications, such as fly-by-wire or auto-pilot landings, cannot tolerate digital system upset due to event upsets. These safety-critical digital computers need to be designed to tolerate such event upsets without affecting the performance of the critical application.

One method to reduce the impact of event upsets on a digital computer is described in U.S. Pat. No. 6,163,480, which is assigned to the same assignee as the present application. The memory system for the digital computer includes a backup memory that includes hardened memory cells. Data that is critical for the dynamic restoration of the digital computer and to the operational state/status of the digital computer prior to the occurrence of a soft fault is stored in the backup memory. After an event upset, the digital computer can retrieve this data from the backup memory, which is not impacted by the event upset. Thus, the digital computer is restored to its operational state prior to the occurrence of the soft fault.

However, the backup memory typically has a write time that is slower than that of the main memory. Thus, an interface is needed between the main memory and the backup memory. Because computations within the digital computer for some applications need to be performed in substantially real time, it would be beneficial to provide an interface that allows critical data to be written to the backup memory without impacting the operation of the digital computer.

SUMMARY

A system and method for providing an interface between memories having different write times is described. The interface is connected between a first memory device and a second memory device. The second memory device may have a write time that is slower than the first memory device. The second memory device may be a hardened latch. The hardened latch may include a storage element characterized such that an amount of energy stored by the hardened latch is sufficiently greater than an amount of energy that could be removed by a threat that could cause an event upset.

The interface includes a latch, control logic, and enable logic. The latch temporarily stores data and address information for a memory access by a processor to the first memory device. The control logic determines whether the data is to be stored in the second memory device. If the control logic determines that the data is to be stored in the second memory device, then the control logic identifies an address in the second memory device to store the data. The enable logic then allows the data to be written into the address of the second memory device as identified by the control logic.

The latch includes a first-in first-out integrated circuit for temporarily storing the data and address information while the control logic determines whether the data is to be stored in the second memory device. The latch further includes a first stage device and a second stage device. The first-in first-out integrated circuit transfers the data to the first stage device if the control logic determines that the data is to be stored in the second memory device. The data is then transferred from the first stage device to the second stage device. The integrity of the data can be verified while the data is being transferred to the second stage device.

The control logic includes circuitry operable to enable the latch. The control logic also includes an index counter that determines where the data is to be written in the second memory device for each frame. The control logic further includes a programmable array that identifies what data is to be stored in the second memory device. The control logic further includes circuitry that enables retrieval of the data from the second memory device and the transfer of this data to the first memory device. Additionally, the control logic includes circuitry operable to initialize a memory block in the second memory device.

The interface also includes data validity logic that determines whether the data is valid prior to writing the data into the second memory device. The data validity logic performs a test to determine that the data is valid. The test may be a cyclic redundancy check, a parity check, a check-bit code test, or a checksum test. The interface further includes a state machine to control the operation of the interface.

The interface provides frame management, substantially real-time data transfer, variable selection, automatic adjustment of write timing, and data integrity checking prior to writing data into the second memory device. As a result, the interface may provide optimal writing of data from one memory device to another. Once the data has been stored in the second memory device, the processor can use the data stored in the second memory device to recover from an event upset.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
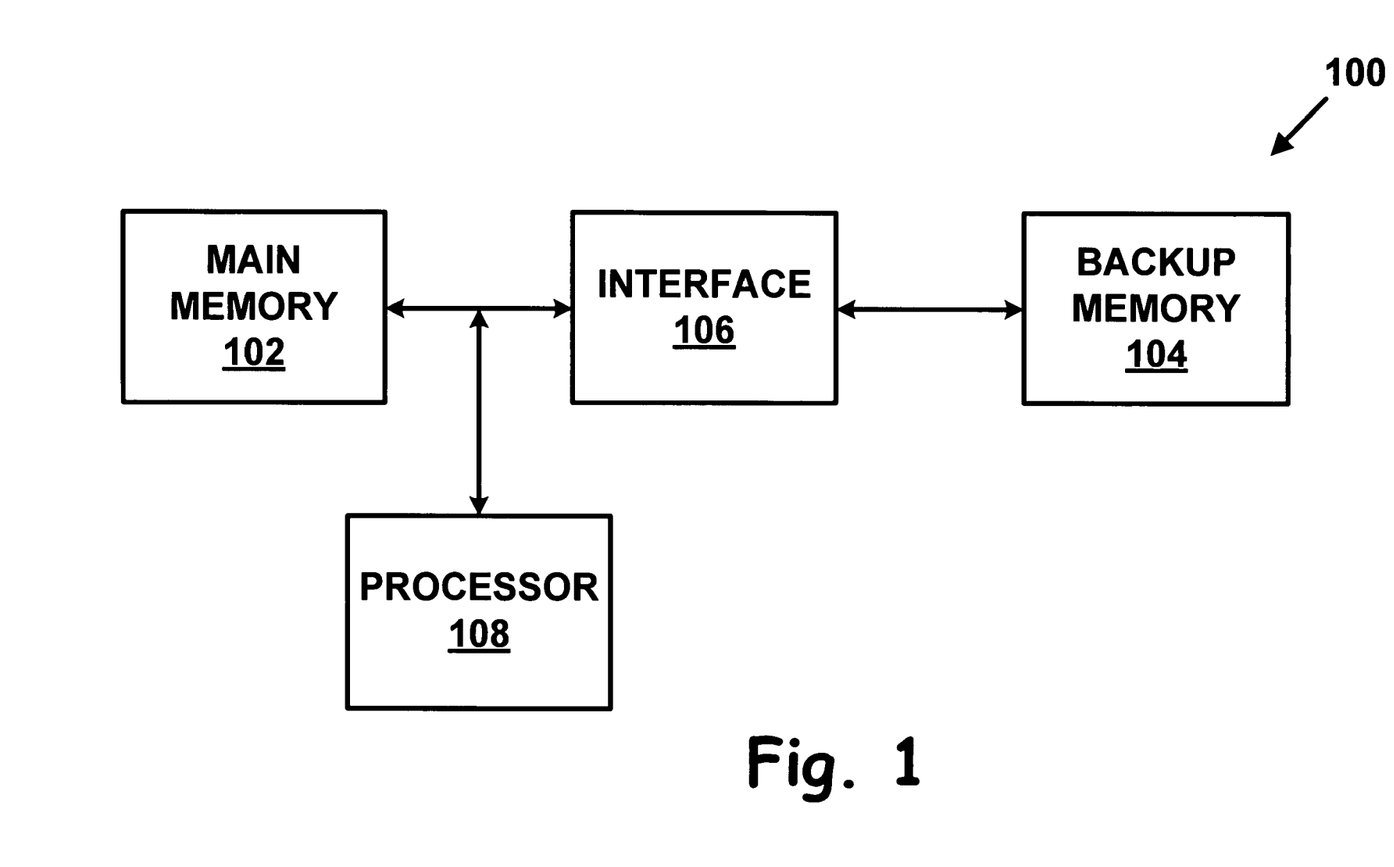
FIG. 1 is a block diagram of a memory system that provides backup memory for a digital computer, according to an example.

FIG. 1 is a block diagram of a memory system 100 that provides backup memory for a digital computer. The memory system 100 includes a main memory 102 and a backup memory 104. The main memory 102 is connected to the backup memory 104 via an interface 106. During normal operation, a processor 108 generates control and logic state variables and stores them in the main memory 102. However, if data in the main memory 102 becomes corrupted due to an upset event, the processor 108 may reset itself using data stored in the backup memory 104. As a result, the processor 108 may recover from an event upset.

The processor 108 may be any combination of hardware, firmware, and/or software operable to interpret and execute instructions, typically from a software application. For example, the processor may be a microcontroller, a microprocessor, or an application-specific integrated circuit (ASIC). The processor 108 may be a central processing unit (CPU) located in a system, such as a banking system, a business system, a vehicle system, and so on.

The main memory 102 may be a volatile memory, such as RAM. The main memory 102 may store variables and other data used by an application program being run by the processor 108. For example, the main memory 102 may contain predetermined locations for storing various types of data provided by the processor 108. The variables may include control and logic state variables, as well as other data. The main memory 102 may not be hardened against event upsets. As a result, the data stored in the main memory 102 may be corrupted during an event upset.

The backup memory 104 may be either volatile or nonvolatile memory that has been hardened against event upsets. As a result, data in the backup memory 104 may not be impacted by an event upset. For example, data may be preserved by designing memory cells in the backup memory 104 to store large levels of energy relative to the energy contained in an event upset threat. An example of this type of memory cell is described in U.S. Pat. No. 6,163,480, which is incorporated by reference in its entirety. Other memory cell designs may also be used.

The data written to the backup memory 104 may include control and logic state variables. The control and logic state variables may be used by the application program that the processor 108 is running. For example, in an automatic flight control system application, the backup memory 104 may include a location dedicated to storing present and/or past values of an integrator for glide slope beam error. If an event upset occurs during an auto-pilot landing, the processor 108 can rapidly recover from the event upset by obtaining the integrator values from the backup memory 104. As a result, the processor 108 can continue to provide accurate glide slope data to the auto-pilot system so that the aircraft may follow the correct glide slope path to the runway, increasing the chance of a successful landing.

The write time of a memory cell in the main memory 102 may be faster than the write time of a memory cell in the backup memory 104. As a result, an interface is needed between the memories 102, 104 to control the data flow between the devices. In some applications, the computations within the processor 108 must be performed at substantially real time. Thus, it is beneficial for the interface 106 between the main memory 102 and the backup memory 104 to allow writing to the backup memory 104 without impacting the operation of the processor 108.

Figure 2:
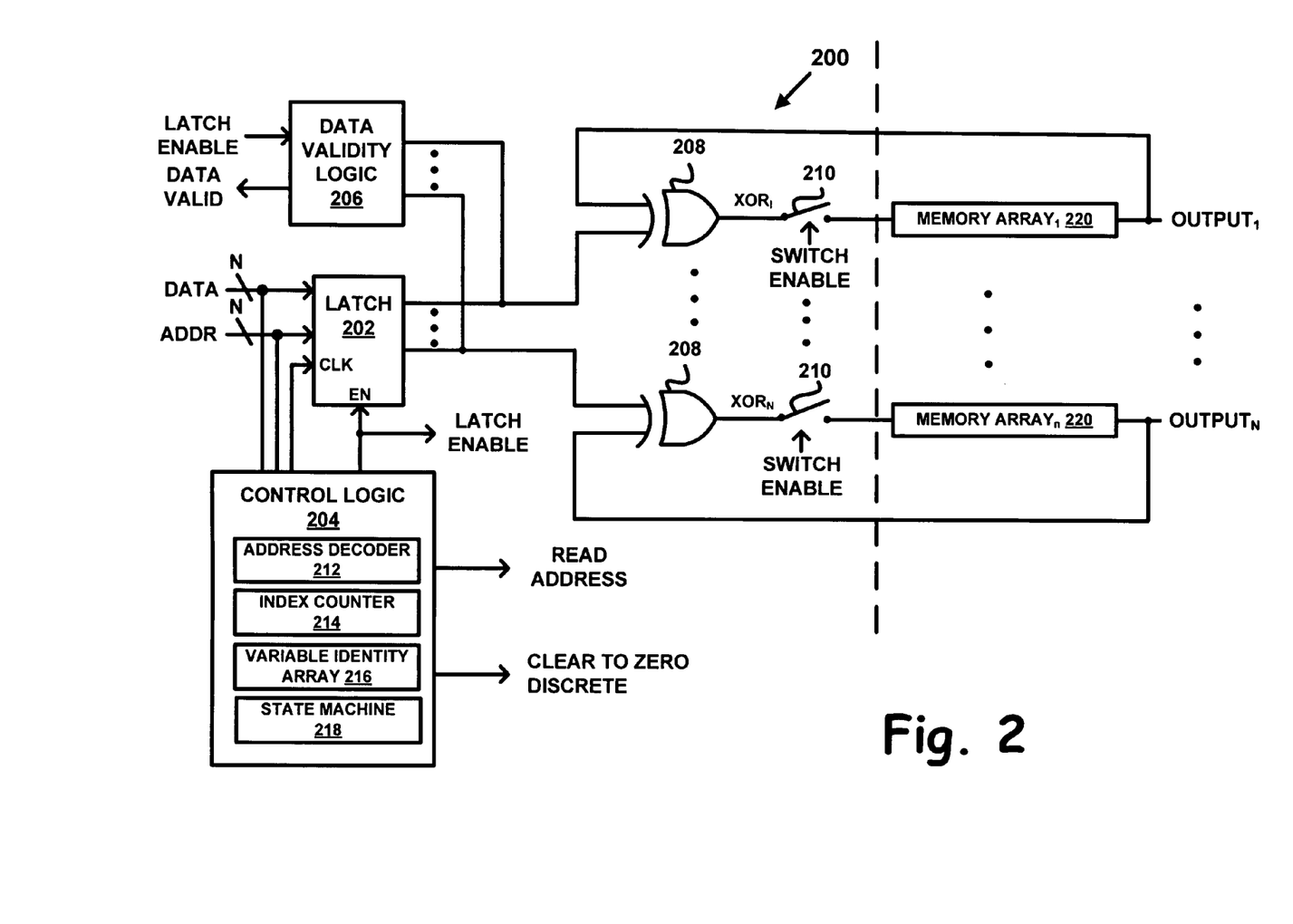
FIG. 2 is a circuit diagram of an interface for memories having different write times, according to an example.

FIG. 2 is a circuit diagram of an interface 200 for memories having different write times. The interface 200 is substantially the same as the interface 106 depicted in FIG. 1. The interface 200 is designed to be connected between a first memory device and a second memory device. The first memory device has a faster write time than the second memory device. For example, the first memory device may be the main memory 102 and the second memory device may be the backup memory 104 as depicted in FIG. 1. However, the interface 200 may be used in other memory applications as well.

The interface 200 provides frame management, substantially real-time data transfer, variable selection, and automatic adjustment of write timing as further described below. Additionally, the interface 200 may provide data integrity checking prior to writing data into the second memory device. As a result, the interface 200 may provide optimal writing of data from one memory device to another.

The interface 200 includes a latch 202, control logic 204, data validity logic 206, logic gates 208, and switches 210. The latch 202 receives data and address information during a memory access of the first memory device. The latch 202 provides temporary data storage so that the data may be written into a memory array 220 of the second memory device without impacting the operation of the processor 108. As a result, the interface 200 may accommodate the fast write times of the first memory device, as well as other fast memory features such as data bursting (i.e., interleaving), double data rates, and unlimited write cycles.

The latch 202 also receives control signals from the control logic 204. The control signals to the latch 202 may include a latch enable signal and a clock signal. The control logic 204 may also provide additional control signals to the latch 202, such as an initialize signal. The latch enable signal may enable a block of words to be written during a particular computing frame or clock cycle (i.e., a particular time slot). Frame time may be defined as the time between consecutive repetitions of an application. A multitasking processing platform can execute multiple applications. For example application 1 may execute for the first 3 ms, application 2 may execute for the next 2 ms, application 3 may execute for the next 4 ms, and one 1 ms may be consumed for operating system and application switching. Thus, in this example, frame time is 10 ms.

The control logic 204 may include any combination of hardware, software, and/or firmware. The control logic 204 includes an address decoder 212, an index counter 214, a variable identity array 216, and a state machine 218. The control logic 204 may include additional devices as well. Additionally, the address decoder 212, the index counter 214, the variable identity array 216, and the state machine 218 may each include multiple devices to perform their functions. Alternatively, the address decoder 212, the index counter 214, the variable identity array 216, and the state machine 218 may be co-located in the same device.

The address decoder 212 provides a mechanism for determining where to store the data in the second memory device. The address decoder 212 uses data from the index counter 214 and the variable identity array 218 to determine where to store the data. The address decoder 212 may be any combination of hardware, software, and firmware operable to determine where to store the data in the second memory device.

The index counter 214 provides frame management. The index counter 214 points to a particular memory array or block in the second memory device for a particular frame. Once a frame has completed, the index counter 214 points to the next memory array in the second memory device. For example, the index counter 214 may point to memory array₁ during frame 1, memory array₂ during frame 2, and memory array$_n$ during frame n. Each memory array can contain 1 to N memory locations.

The index counter 214 may be any combination of hardware, software, and/or firmware that provides a counting and/or pointing mechanism. The index counter 214 enables each consecutive processing frame (or iteration) to reside in a unique array location in the second memory device. The number of memory arrays in the second memory device can be from 1 to N.

The variable identity array 216 is a programmable array that includes identifiers for variables and/or other information that is critical to the particular application being run by the processor 108. For example, the variable identity array 216 may include a content addressable memory (CAM). Upon receipt of data, the CAM searches through its memory for the location of the data in memory. If the data is found, the CAM provides as its output the address of the data in memory. The CAM may identify an address match in a single clock period. The CAM is typically programmed prior to device operation and can be rewritten during device operation. For example, the CAM may be a programmable read only memory (PROM) table. Other devices or combination of devices may also be used for the variable identity array 216.

The state machine 218 may be any combination of hardware, software, and/or firmware for controlling the operation of the interface 200. The state machine 218 monitors the communications between the processor 108 and the first memory device. Upon a memory access of the first memory device, the state machine 218 controls the interface 200 to transfer the data identified as being critical to the operation of the processor 108 to the memory array 220. Additionally, the state machine 218 controls the interface 200 to retrieve the data from the memory array 220 to allow the processor 108 to recover from an event upset.

The control logic 204 may provide additional control signals. For example, as seen in FIG. 2, the control logic 204 provides a read address signal and a clear to zero discrete signal. Other control signals may be generated as well. The read address signal may be used when the processor 108 or other device needs to obtain the data stored in the memory array 220. The clear to zero discrete signal may be used to initialize the memory array 220. The initial state of the memory array 220 may be either a logic-0 level or a logic-1 level depending on the particular application. Additionally, the clear to zero discrete signal may be used to generate a pulse signal that initializes the memory array 220.

Figure 3:
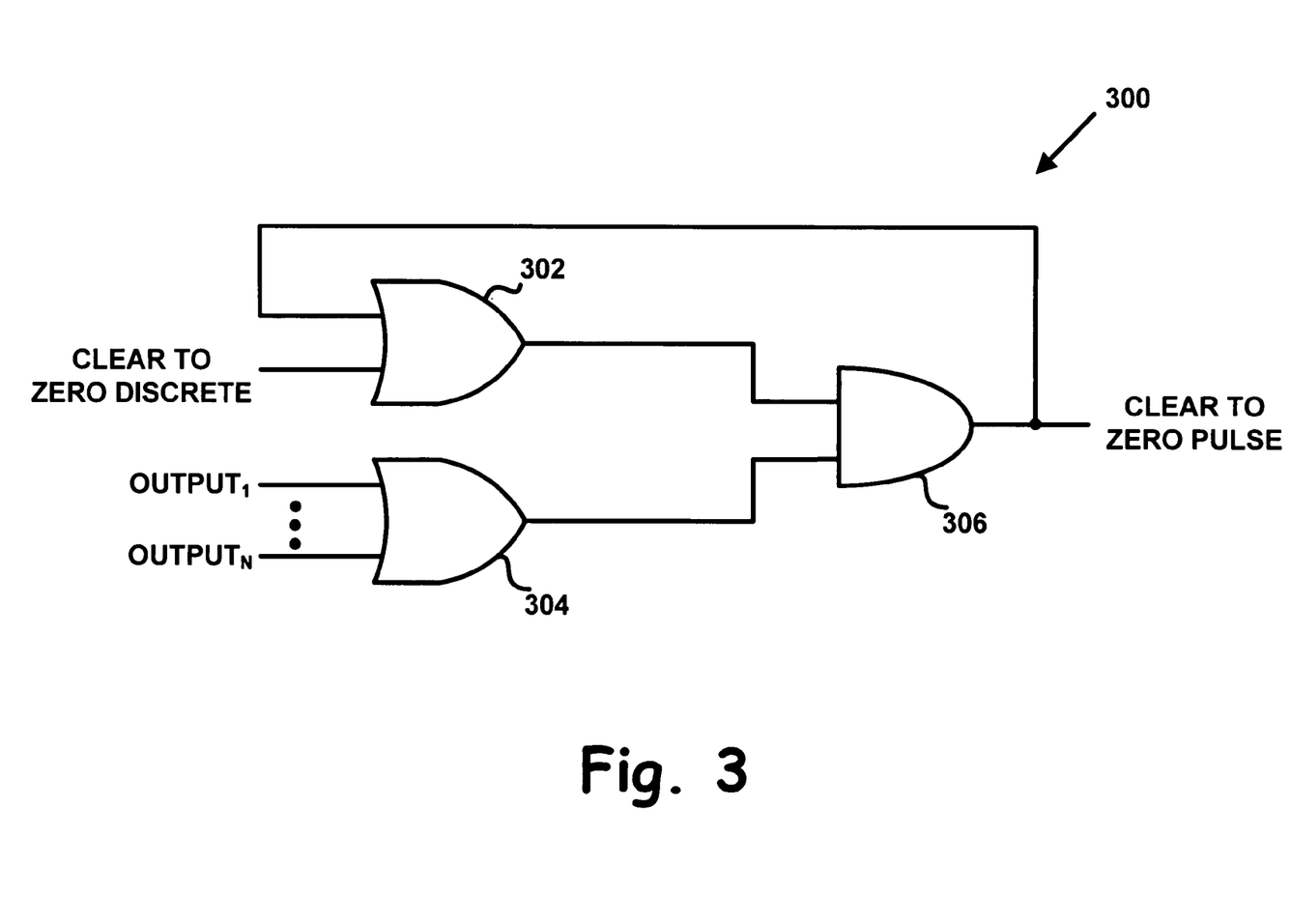
FIG. 3 is a circuit diagram of circuit for generating a clear to zero pulse signal, according to an example.

FIG. 3 is a circuit diagram of a circuit 300 for generating a clear to zero pulse signal. The circuit 300 includes a first OR gate 302, a second OR gate 304, and an AND gate 306. The clear to zero discrete signal from the control logic 204 is connected to an input of the first OR gate 302. An output from the AND gate 306 is connected to another input of the first OR gate 302. An output of the first OR gate 302 is connected to an input of the AND gate 306. The outputs from the memory array 220 are connected to the inputs of the second OR gate 304. For example, if there are sixteen memory arrays 220, each providing an output signal, there will be sixteen inputs to the second OR gate 304. An output of the second OR gate 304 is connected to an input of the AND gate 306.

The output of the AND gate 306 provides a clear to zero pulse signal. When at least one of the outputs from the memory array 220 is at a logic-1 level, one input to the AND gate 306 is at a logic-1 level. When the memory array 220 is to be cleared by the activation of the clear to zero discrete signal, the output of the AND gate 306 transitions from a logic-0 level to a logic-1 level. Because of the feedback from the output of the AND gate 306 to the input of the first OR gate 302, the output of the AND gate 306 stays at a logic-1 level until all memory cell outputs are cleared before transitioning to a logic-0 level. As a result, the clear to zero discrete signal does not need to remain activated until all of the memory arrays 220 in the second memory device have been cleared. Other circuit and/or software designs may also be used.

Returning to FIG. 2, the data validity logic 206 may be used to detect if the data is corrupted prior to being latched into the memory array 220. The data outputs of the latch 202 are connected to the inputs of the data validity logic 206. The latch enable signal from the control logic 204 is also connected to an input of the data validity logic 206. When the data validity logic 206 is enabled and is receiving data from the latch 202 on its data inputs, the data validity logic 206 performs a test to determine whether the data from the latch 202 has been corrupted. Preferably, the data validity logic 206 performs a cyclic redundancy check (CRC) of the data. However, other tests, such as a check-bit code test, a parity check, or a checksum test may be used to verify the integrity of the data. The particular application being performed by the processor 108 may determine which data validity test the data validity logic 206 uses.

The data validity logic 206 provides as an output a data valid signal. The data validity logic 206 may be designed so that the data valid signal provides either a logic-1 or a logic-0 output. The data valid signal may be used to enable the transfer of data from the latch 202 to the second memory device as further described with reference to FIG. 4. The data validity logic 206 may provide additional outputs as well.

The data outputs from the latch 202 are also connected to the logic gates 208. There may be one logic gate 208 for each data output bit from the latch 202. However, the logic gates 208 may be packaged together in a single integrated circuit package. Preferably, the logic gates 208 are exclusive OR (XOR) gates. Each XOR gate has two inputs and one output. As previously described, one of the inputs to the XOR gate is connected to a data output bit from the latch 202. The output of the XOR gate is connected to an input of one of the switches 210. An output of the switch 210 is connected to a memory array 220 in the second memory device. An output of the memory array 220 is connected to the second input of the XOR gate. The combination of the logic gates 208 and the switches 210 may be referred to as enable logic.

The output of the logic gate 208 is at a logic-1 level when the data in the associated memory array 220 is different than the data received from the latch 202 (i.e., new data). Additionally, the output of the logic gate 208 is at a logic-0 level when the data in the associated memory array 220 is the same as the data received from the latch 202. The outputs of the logic gates 208 are then provided as inputs to a control circuit for controlling the switches 210 as described with reference to FIG. 4.

The switches 210 are connected between the output of the logic gates 208 and the inputs of the memory array 220, and are controlled by a switch enable signal. The switches 210 may be designed so that when the switch enable signal is at a logic-1 level, the switches 210 are closed and when the switch enable signal is at a logic-0 level, the switches 210 are open. When the switches 210 are enabled, data at the output of the logic gates 208 may be written into the memory array 220 of the second memory device.

Figure 4:
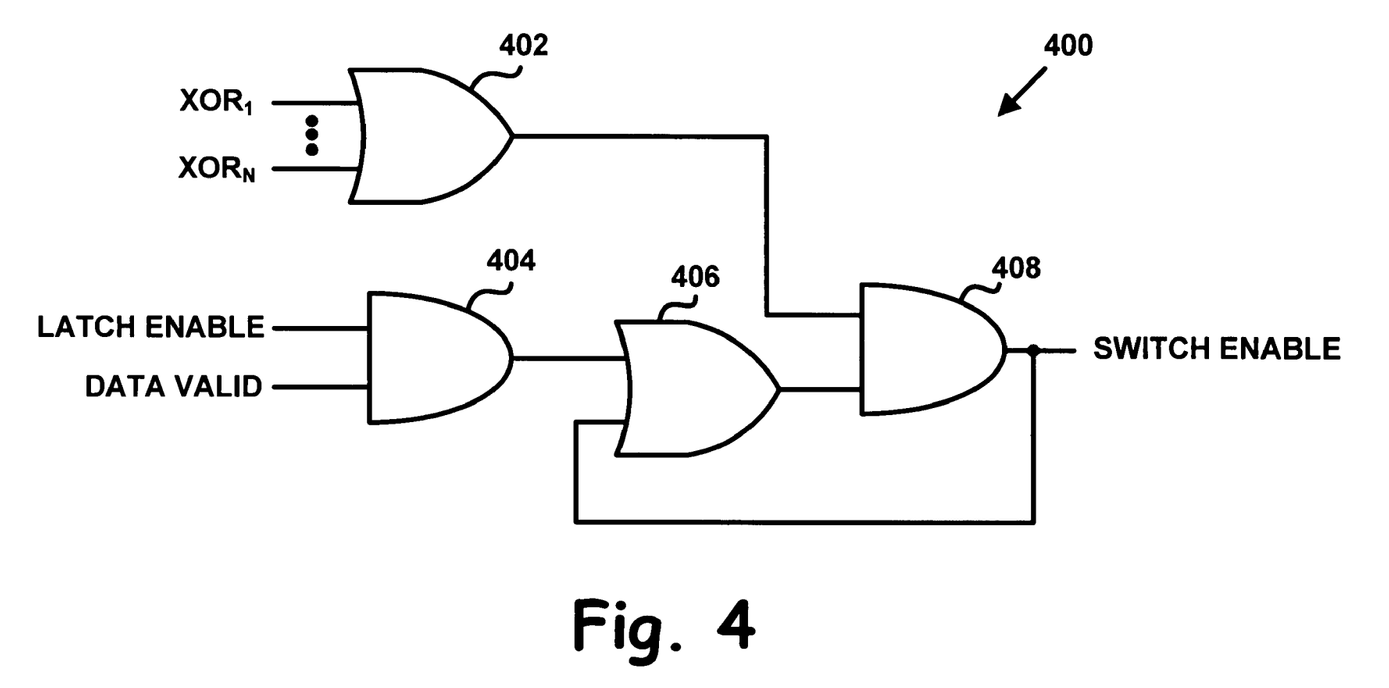
FIG. 4 is a circuit diagram of a circuit for controlling data flow to a second memory device, according to an example.

FIG. 4 is a circuit diagram of circuit 400 for controlling data flow to the second memory device. The circuit 400 includes a first OR gate 402, a first AND gate 404, a second OR gate 406, and a second AND gate 408. Each output from the logic gates 208 is connected to an input of the first OR gate 402. For example, if there are sixteen logic gates 208, the sixteen outputs from the logic gates 208 are connected to sixteen inputs of the first OR gate 402. The first OR gate 402 has an output that is connected to an input of the second AND gate 408.

The latch enable signal from the control logic 204 and the data valid signal from the data validity logic 206 are connected to inputs of the first AND gate 404. An output of the first AND gate 404 is connected to an input of the second OR gate 406. An output of the second OR gate 406 is connected to an input of the second AND gate 408. An output of the second AND gate 408 is connected to an input of the second OR gate 406.

The output of the second AND gate 408 is the switch enable signal that controls the switches 210. As described above, when the switch enable signal is at a logic-1 level, the switches 210 are closed and when the switch enable signal is at a logic-0 level, the switches 210 are open. The circuit 400 is designed to provide a logic-1 output (i.e., assert the switch enable signal) if both the latch enable signal and the data valid signal are at a logic-1 level and new data is ready to be written into the memory array 220. The switch enable signal may stay asserted until all data bits have been committed to the memory array 220, even if the latch enable signal is de-asserted. Other combinations of hardware, software, and/or firmware may also be used to control the switch enable signal.

Returning to FIG. 2, the latch 202, the control logic 204, and the data validity logic 206 may be hardened against event upsets. For example, triple modular redundancy (TMR) may be used to harden the latch 202, the control logic 204, and the data validity logic 206. TMR is a redundancy technique that is well known in the art. Other methods for hardening may also be used. As a result, event upsets may not corrupt the data as it being processed in the interface 200, before it is stored in the second memory device.

Figure 5:
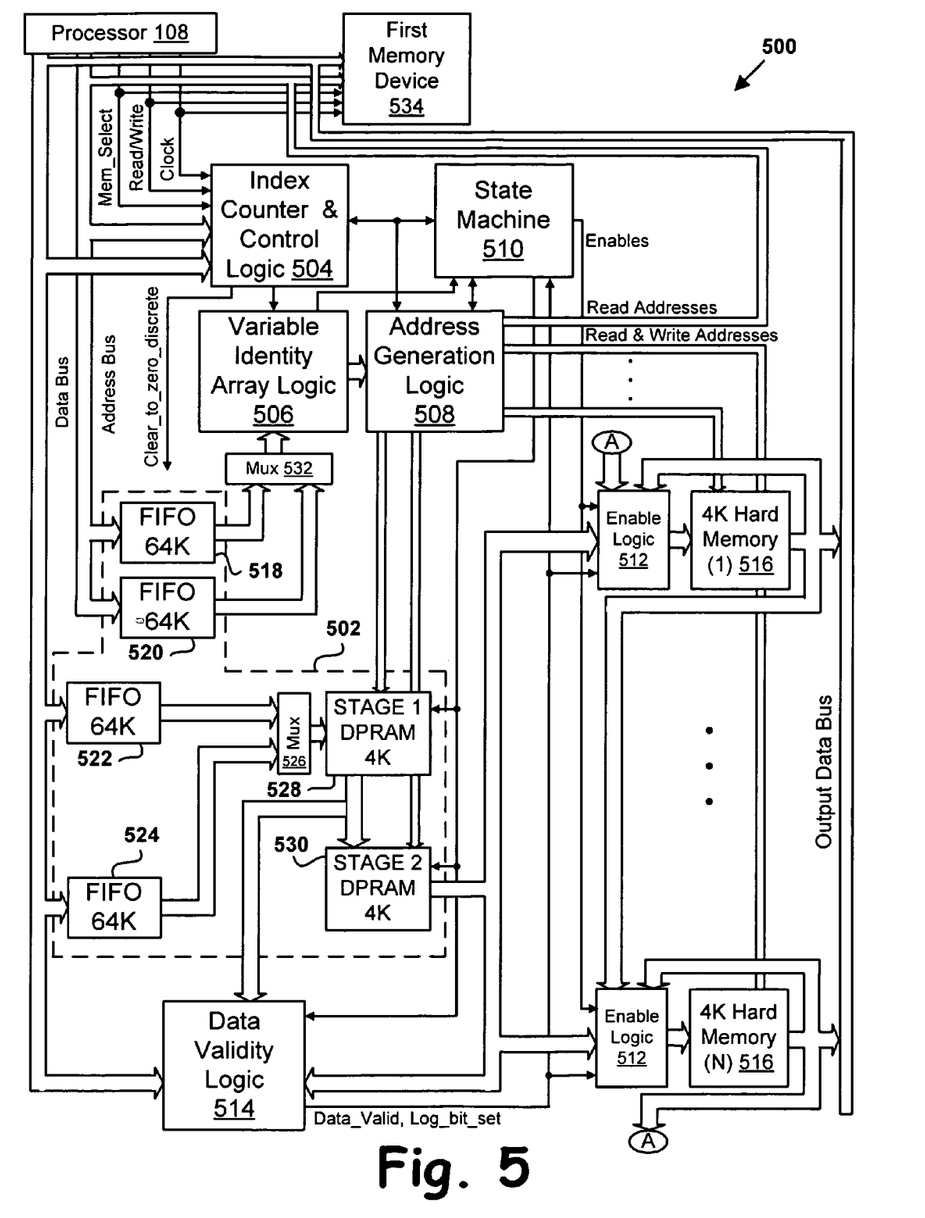
FIG. 5 is a circuit diagram of an interface for memories having different write times, according to another example.

FIG. 5 is a circuit diagram of an interface 500 for memories having different write times. The interface 500 includes a latch 502, an index counter and control logic 504, variable identity array logic 506, address generation logic 508, a state machine 510, enable logic 512, and data validity logic 514. The interface 500 includes additional circuitry for interfacing between a first memory device 534 and a second memory device 516. For example, the interface 500 includes address buses, data buses, and multiplexers.

FIG. 5 depicts the second memory device 516 as including two hardened memory arrays or blocks. However, the second memory device 516 may have more or less than two hardened memory blocks. For example, only one hardened memory block may be needed in applications in which the processor 108 checks for data errors at each clock cycle. FIG. 5 also depicts each of the hardened memory blocks as having the capability to store four kilobytes of data. However, the hardened memory blocks may be designed to store more or less than four kilobytes of data.

The hardened memory blocks are described in more detail with reference to FIGS. 7 and 8. However, the second memory device 516 may not be a hardened memory device and may be slower than the first memory device 534 for other reasons. The interface 500 is not limited to use with a second memory device that is hardened against event upsets. The interface 500 may be used in any application in which the write time for the second memory device 516 is slower than the first memory device 534.

The latch 502 captures the address and data information when the processor 108 writes data to the first memory device 534. The latch 502 provides temporary data storage so that the data may be written to the hardened memory blocks in the second memory device 516 without impacting the operation of the processor 108. As a result, the interface 500 may accommodate the fast write times of the first memory device 534, as well as other fast memory features such as data bursting (i.e., interleaving), double data rates, and unlimited write cycles.

FIG. 5 depicts one example of a latch 502 design as identified by the dashed-lines. As shown in FIG. 5, the latch 502 includes four first-in first-out (FIFO) integrated circuits 518-524, a multiplexer 526, a first stage device 528, and a second stage device 530. Two of the FIFOs 518, 520 are designed to temporarily store address information received from an address bus, while the other two FIFOs 522, 524 are designed to temporarily store data information received from a data bus. If the interface 500 determines that the data stored in the FIFOs 522, 524 needs to be stored in the second memory device 516, the data is transferred via the multiplexer 526 to the first stage device 528. The data is then transferred from the first stage device 528 to the second stage device 530 as further described below.

Other latch designs may also be used. For example, a single FIFO for storing data, a single FIFO for storing addresses, and a single stage device may be used if the combination of these elements can match the real-time operational characteristics of the first memory device 534. The first and second stage devices 528, 530 are depicted as four kilobyte dual port RAMs (DPRAM); however, other memory devices may be used. Any latch design that is operable to temporarily store address and data information obtained when the processor 108 writes data to the first storage device may be used. As a result, the address and data information may be captured without interfering with the substantially real time operations of the processor 108.

When the processor 108 writes data to the first memory device 534, one of the FIFOs 518-520 stores the address of the memory access and one of the FIFOs 522-524 stores the data transferred to the first memory device 534. One of the address FIFOs 518 is paired with one of the data FIFOs 522, while the other address FIFO 520 is paired with the other data FIFO 524. One pair of address/data FIFOs 518, 522 temporarily stores address and data information during one frame, while the second pair of address/data FIFOs 520, 524 temporarily stores address and data information during the next frame. Switching between the FIFO pairs at each new frame continues during the operation of the processor 108, which is commonly referred to as even/odd switching.

The addresses stored in the FIFOs 518, 520 are transferred to the variable identity array logic 506 via a multiplexer 532. The variable identity array logic 506 is a programmable array that includes identifiers for variables and/or other information that is critical to the particular application being run by the processor 108. For example, the variable identity array logic 506 may be a CAM. If the variable identity array logic 506 has data stored at the address of the memory access, the data transferred during the memory access may be critical to the application and is identified as data to be stored in the second memory device 516.

Once the variable identity array logic 506 has determined that the data needs to be stored in the second memory device 516, the address generation logic 508 determines where in the second memory device 516 that the data is to be stored. The address generation logic 508 uses data from the index counter 504 and the variable identity array logic 506 to determine where to store the data.

The index counter and control logic 504 points to a particular FIFO 522-524. Each time the index counter increments, the control logic 504 alternates to the other FIFO in the pair of data FIFOs 522-524. This allows time for the previous frame's data to be completely transferred into the first stage device 528 and then the second stage device 530. When all of the previous frame's data has been transferred into the second stage device 530, the control logic 504 switches to the alternate FIFO and starts updating the first stage device 528 with the current frame's data.

The transfer of data from the first stage device 528 to the second stage device 530 is accomplished by the state machine 510. As each location in the first stage device 528 is read, an associated log bit is checked to see if the location was updated (written) during the frame. If the log bit is set, indicating that the data was updated (written) during the frame, the data is transferred to the second stage device 530 at the end of a frame. If the log bit is not set, the state machine 510 increments the address and moves to the next location in the first stage device 528. The use of log bits is a time saving means for transferring data from the first stage device 528 to the second stage device 530; however, data transfer may be accomplished with different means.

The data transferred from the first stage device 528 to the second stage device 530 at the end of frame 1 is transferred from the second stage device 530 to the second memory device 516 during frame 2. The second stage device 530 holds the previous frame's data while the state machine 510 transfers the data to the second memory device 516.

The control logic 504 and the variable identify array logic 506 provide the address generation logic 508 with the memory location to store the data, and the address generation logic 508 generates the associated address for that memory location. The control logic 504 also generates a clear to zero discrete signal, which may be used to initialize the second memory device 516.

The address generation logic 508 provides the address to which the data is to be written into the first and second stage devices 530, 532. The address generation logic 508 also provides the address to the second memory device 516. The data is transferred from the FIFOs 522, 524 via the multiplexer 526 to the first stage device 528. The state machine 510, which controls the operation of the interface 500, enables the writing of the data into the first and second stage devices 530, 532 at the address generated by the address generation logic 508. The data is then temporarily stored in each of the first and second stage devices 530, 532. The operation of the state machine 510 is further described with reference to FIG. 6.

As the data is transferred from the second stage device 530 to the second memory device 516, the data validity logic 514 may be used to detect if the data is valid. When the data validity logic 514 is enabled by the state machine 510, the data validity logic 514 may test the data stored in the second stage device 530 using CRC, check-bit codes, or any other appropriate data validation method. If the data is invalid, the interface 500 may discard the data, correct the data, or perform any other appropriate action. If the data is valid, the data validity logic 514 may send a data valid signal to the state machine 510 indicating that the data temporarily stored in the second stage device 530 is valid and can be written into the second memory device 516.

The data temporarily stored in the second stage device 530 may then be transferred to the second memory device 516 via the enable logic 512. The enable logic 512 receives the data valid signal from the data validity logic 514 and an enable from the state machine 510. The enable from the state machine 510 enables writing of the data into the second memory device 516 based on the index counter and control logic 504.

The previous discussion described how data written to the first memory device 534 may be latched by data FIFOs 522, 524 and, if determined to be critical, transferred to the second memory device 516 via the first stage device 528 and the second stage device 530. It is important to note that these data transfers can operate in parallel. In the following example, it is assumed that all of the data written to the first memory device 534 is determined to be critical. However, during normal operation of the interface 500 it is likely that not all of the data written to the first memory device 534 needs to be transferred to the second memory device 516. Further, the following example shows parallel operation for just three frames. It is understood that the parallel nature of the data transfers can occur for more or less than three frames.

At frame 1, $data_1$ from a first memory access is latched by the data FIFOs 522, 524 and transferred to the first stage device 528. At the end of frame 1, $data_1$ is transferred to the second stage device 530. At frame 2, $data_2$ from a second memory access is latched by the data FIFOs 522, 524 and transferred to the first stage device 528; while $data_1$ is transferred to the second memory device 516. At the end of frame 2, $data_2$ is transferred to the second stage device 530. At frame 3, $data_3$ from a third memory access is latched by the data FIFOs 522, 524 and transferred to the first stage device 528; while $data_2$ is transferred to the second memory device 516. At the end of frame 3, $data_3$ is transferred to the second stage device 530. This transfer of data may continue in this fashion during the operation of the processor 108.

Other timing methods for transferring the data between different data storage devices may also be implemented. By implementing a parallel operation for data transfer from the first memory device 534 to the second memory device 516, the interface 500 can continuously monitor for memory accesses, while transferring the data. As a result, the first memory device 534 can absorb the faster write times of the first memory device 534 without losing critical data that needs to be written into the second memory device 516.

Once the data has been stored in the second memory device 516, the processor 108 can use the data to recover from an event upset. The interface 500 provides frame management, substantially real-time data transfer, variable selection, automatic adjustment of write timing, and data integrity checking prior to writing data into the second memory device. As a result, the interface 500 may provide optimal writing of data from one memory device to another.

Figure 6A:
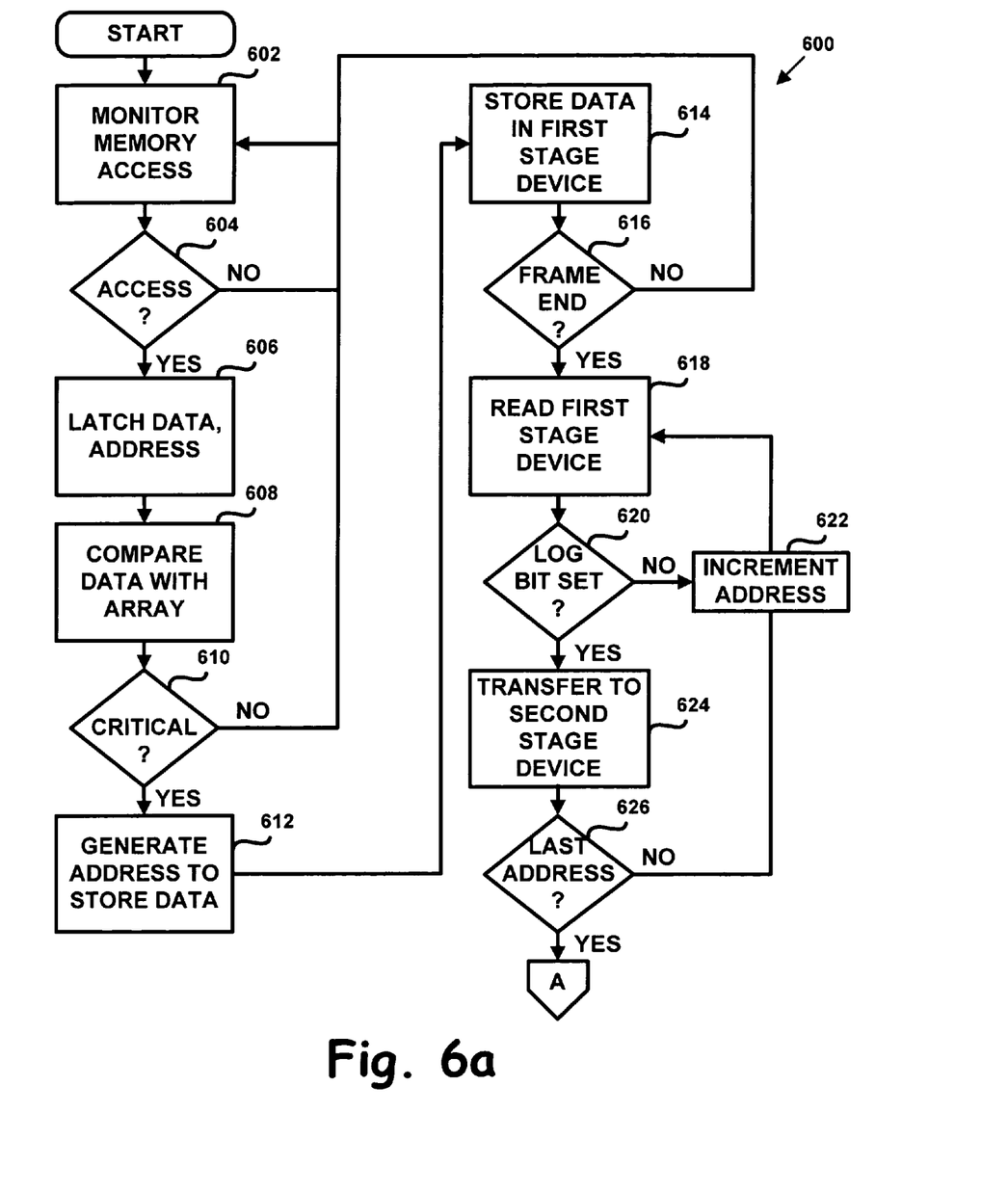
FIG. 6 is a flow chart for a state machine that controls the interface for memories having different write times depicted in FIGS. 2 and 5, according to an example.
Figure 6B:
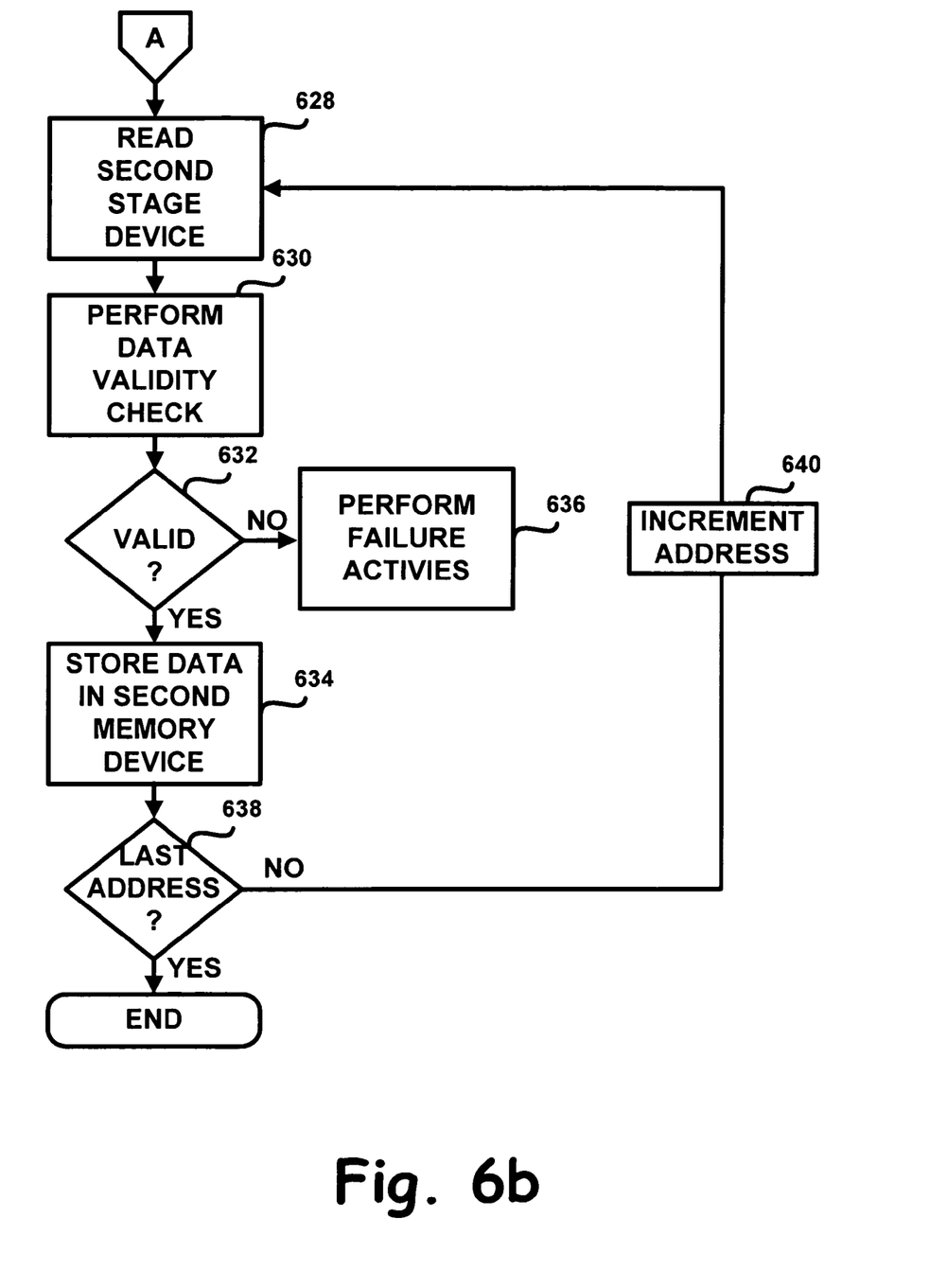

FIG. 6 is a flow chart 600 providing an overview of the activities performed by the state machine 510 to control the operations of the interface 500. At block 602, the state machine 510 monitors whether the processor 108 writes data to the first memory device 534. If at block 604, the processor 108 does not write data to the first memory device 534, monitoring continues at block 602. If at block 604, the processor 108 does write data to the first memory device 534, the state machine 510 instructs the latch 502 to store the data and associated address in the FIFOs 518-524 at block 606.

At block 608, when there is data in the FIFO 522, 524, the state machine 510 activates the variable identity array logic 506 to determine if the data is critical to the operation of the application being run by the processor 108. If at block 610, the variable identity array logic 506 determines that the data is not critical, the data is discarded and the state machine 510 continues to monitor for memory accesses at block 602.

If at block 610, the variable identity array logic 506 determines that the data is critical, at block 612 the state machine 510 causes the address generation logic 508 to generate an address for storing the data based on the variable identity array value. At block 614, the state machine 510 instructs the latch 502 to transfer the data to the first stage device 528. The data is read from the FIFOs 522-524 and stored in the first stage device 528. The log bit is set as well. Additionally, a data integrity code may be stored in the first stage device 528 depending on the type of test conducted by the data validity logic 514.

At block 616, the state machine 510 determines if the current frame has ended based on information received from the index counter and control logic 504. An application running on the processor 108 may increment the index counter at the end of each frame. The state machine 510 may determine that the current frame has ended by determining whether the index counter has incremented. If the current frame has not ended, at block 612 the state machine 510 resumes monitoring memory accesses at block 602. If the current frame has ended, the state machine 510 transfers the data in the FIFOs 522-524 to the first stage device 528.

At block 618, the state machine 510 sets the address to start reading from the first stage device 528. The data in the address of the first stage device 528 is read. At block 620, the state machine 510 determines whether the log bit has been set. If the log bit has not been set, the address is incremented at block 622. If the address is incremented at block 622, the data in that address of the first stage device 528 is read at block 618. However, if the log bit has been set at block 620, the data in the first stage device 528 is transferred to the second stage device 530 at block 624.

At block 626, the state machine 510 determines whether all the data has been transferred from the first stage device 528 to the second stage device 530. If the last address of the first stage device 528 has not been read, the address is incremented at block 622. If the address is incremented at block 622, the data in that address of the first stage device 528 is read at block 618. However, if the last address of the first stage device 528 has been read, all the data in the first stage device 528 has been transferred to the second stage device 530.

At block 628, the state machine 510 sets the address to start reading from the second stage device 530. The data in the address of the second stage device 530 is then read. At block 630, the state machine 510 activates the data validity logic 514. The data validity logic 514 determines if the data stored in the second stage device 530 is valid. At block 632, if the data is not valid, at block 636 the interface 500 may discard the data, correct the data, or perform any other appropriate action. The action taken by the interface 500 upon determining that the data is not valid may depend on the application being run by the processor 108.

If the data is valid at block 632, the state machine 510 causes the data in the second stage device 530 to be stored in the second memory device 516. At block 638, the state machine 510 determines whether all the data has been transferred from the second stage device 530 to the second memory device 516. If the last address of the second stage device 530 has not been read, the address is incremented at block 640. If the address is incremented at block 640, the data in that address of the second stage device 530 is read at block 628. However, if the last address of the second stage device 530 has been read, all the data in the second stage device 530 has been transferred to the second memory device 516.

It should be understood that any of the steps depicted in the flow chart 600 may occur simultaneously or in a different order. For example, the flow chart 600 shows a sequential flow. However, it is understood that the state machine 510 may control data transfers (i.e., FIFOs 522-524 to first stage device 528, first stage device 528 to second stage device 530, and second stage device 530 to second memory device 516) in a parallel manner.

The state machine 510 can perform additional functions as well. For example, the state machine 510 may be used to control the retrieval of the data from the second memory device 516 to restore the processor 108. Alternatively, a direct memory access (DMA) controller function may be used to control the retrieval of the data from the second memory device 516 to restore the processor 108. Additionally, more than one state machine may be used to control different aspects of the interface 500 operation. The state machine 510 may be any combination of hardware, software, and/or firmware.

Figure 7:
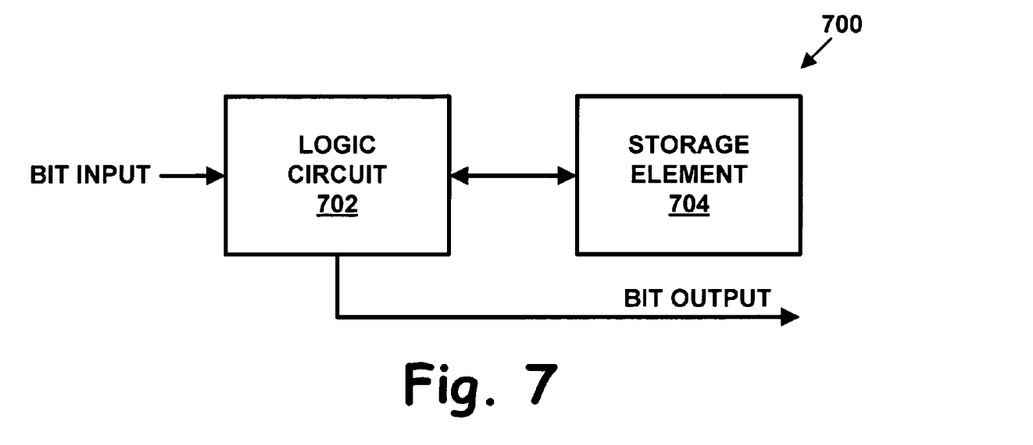
FIG. 7 is a block diagram of a hardened latch that can be used to harden a memory cell against event upsets, according to an example.

FIG. 7 is a block diagram of a hardened latch 700 that can be used to harden a memory cell against event upsets. The memory cell can be either volatile or nonvolatile memory. The hardened latch 700 includes a logic circuit 702 and a storage element 704. The storage element 704 may include one or more storage elements. An input to the hardened latch 700 is connected to the logic circuit 702. The input is a memory bit input. An output of the hardened latch 700 is also connected to the logic circuit 702. The output is a memory bit output. The logic circuit 702 is connected to the storage element 704. The hardened latch 700 may include additional devices as well.

The storage element 704 is an energy storage element in which energy storage mechanisms are sufficiently reversible to permit an unlimited number of writes and reads. The energy may be, for example, an electric field, a magnetic field, an electromagnetic field, photon energy, chemical energy, quantum energy, or lattice changes within material atomic structures. To change the state of the storage element 704 (i.e., from a low to high state or from a high to low state), energy storage must be sufficiently complete or sufficiently removed. For example, when the storage element 704 is at a low state, a threshold amount of energy must be stored by the storage element 704 before the storage element 704 will transition to a high state. Similarly, when the storage element 704 is at a high state, a threshold amount of energy must be removed from the storage element 704 before the storage element 704 will transition to a low state.

The storage element 704 may be capable of storing an amount of energy that is greater than an amount of energy that could damage components within the logic circuit 702. In this case, if an event upset occurs that generates enough energy to damage a component within the logic circuit 702, data stored in the storage element 704 may not be lost. The amount of energy that the storage element 704 can store, which impacts the time to change states, determines the degree of hardness of the hardened latch 700.

The storage element 704 may be designed to store an amount of energy suitable for a particular application in which the hardened latch 700 is to be used. For example, a circuit that is expected to continue operations during and after a nuclear bomb detonation may include hardened latches 700 that have storage elements 704 that can store more energy than hardened latches 700 that are not exposed to such harsh environments. The storage element 704 may also be designed to maintain its state if power is removed.

The logic circuit 702 controls storage and removal of energy in the storage element 704. The logic circuit 702 may be designed so that gates in the logic circuit 702 may change states due to an event upset, but the state of the storage element 704 is not impacted by the event upset. An example logic circuit 702 is depicted in FIG. 8; however, other circuit designs may be used.

Figure 8:
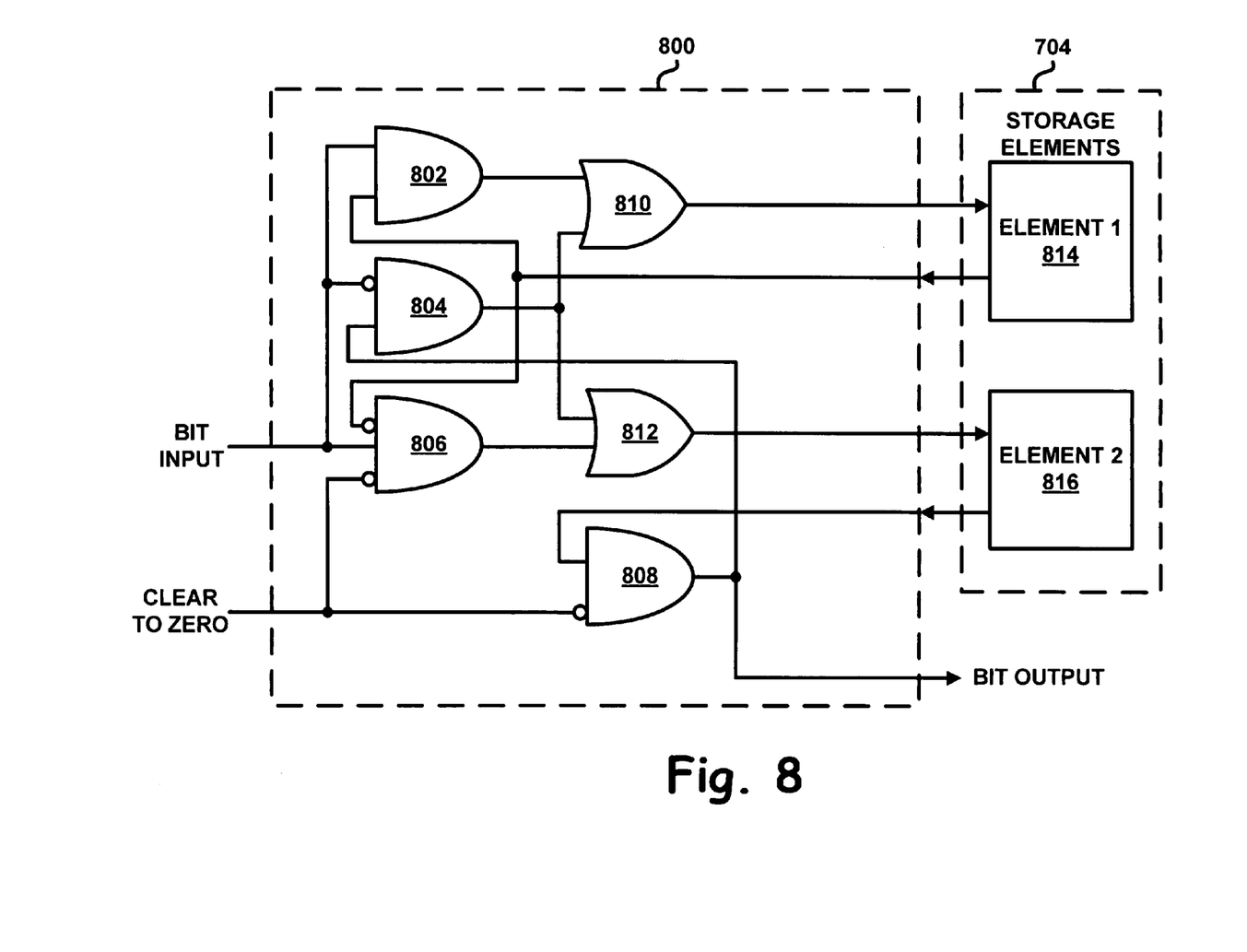
FIG. 8 is a circuit diagram of a logic circuit to be used with a storage element of a hardened latch depicted in FIG. 7, according to an example.

FIG. 8 is a circuit diagram of a logic circuit 800 designed to be used with the storage element 704 in the hardened latch 700. The storage element 704 is depicted in FIG. 8 as having a first storage element 814 and a second storage element 816. The first and second storage elements 814, 816 may include resistors and capacitors. Alternatively, the first and second storage elements 814, 816 may include resistors and inductors. However, other types of storage elements may be used. Additionally, one storage element or more than two storage elements may be used in the storage element 704 depending on the design of the logic circuit 800.

FIG. 8 depicts a toggle flip-flop design of the logic circuit 800; however, other circuit designs may be used. The logic circuit 800 includes four AND gates 802-808 and two OR gates 810-812. The BIT input signal to the hardened latch 700 is connected to an input of three of the AND gates 802-806 (non-inverting input of AND gates 802, 806, inverting input of AND gate 804). The clear to zero discrete signal from the control logic 504 is connected to inverting inputs of two of the AND gates 806-808. The BIT output signal is connected to an output of the AND gate 808 and a non-inverting input to the AND gate 804.

The output of the AND gate 806 is connected to an input of the OR gate 812. The second input to the OR gate 812 is connected to the output of the AND gate 804 and an input of the OR gate 810. An output of the OR gate 812 transfers energy (e.g., charges a capacitor, flips magnetic spin) for storage in the second storage element 816. An output of the second storage element 816 in connected to a non-inverting input of the AND gate 808. An output of the AND gate 802 is connected to an input of the OR gate 810. An output of the OR gate 810 transfers energy for storage in the first storage element 814. An output of the first storage element 814 is connected to a non-inverting input of the AND gate 802 and an inverting input of the AND gate 806.

The logic circuit 800 is designed so that when the BIT input signal is at a logic-1 level, the BIT output signal changes state (i.e., from a logic-0 level to a logic-1 level or from a logic-1 level to a logic-0 level). Additionally, when the BIT input signal is at a logic-0 level, the BIT output signal does not change states. During an event upset, the BIT input signal or another connection within the logic circuit 800 may change to a false state; however, the state of the storage element 704 does not transition. Moreover, if an event upset occurs that generates enough energy to damage a component within the logic circuit 800 (i.e., gates 802-812), data stored in the storage element 704 (i.e., elements 814, 816) may not be lost.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. An interface for memories having different write times comprising in combination:
a latch that stores data and address information for a memory access of a processor to a first memory device;
control logic that determines whether the data is to be stored in a second memory device, wherein the second memory device is a hardened latch that includes a logic circuit and a storage element, wherein an amount of energy that can be stored in the storage element is greater than an amount of energy that can be removed by an event upset, and wherein if the control logic determines that the data is to be stored in the second memory device then the control logic identifies an address in the second memory device in which to store the data, and if the control logic does not determine that the data is to be stored in the second memory device then the control logic does not identify an address in the second memory device in which to store the data and the data is discarded;

enable logic configured to control the writing of the data to the second memory device, wherein the enable logic enables the data to be written into the address of the second memory device as identified by the control logic; and wherein the latch includes one or more stage devices that temporarily store the data before the data is written to the second memory device to compensate for the difference in write times between the first and second memory devices, and wherein the time required to write the data to the second memory device is greater than the time required to write the data to the first memory device.

2. The interface of claim 1, wherein the latch includes a first-in first-out integrated circuit for temporarily storing the data and address information while the control logic determines whether the data is to be stored in the second memory device.

3. The interface of claim 2, wherein the latch further includes a third memory device to receive the data from the first-in first-out integrated circuit if the control logic determines that the data is to be stored in the second memory device.

4. The interface of claim 1, wherein the control logic includes an index counter that determines where the data is to be written in the second memory device for each consecutive frame.

5. The interface of claim 1, wherein the control logic includes circuitry operable to enable the latch.

6. The interface of claim 1, wherein the control logic includes a programmable array that identifies what data is to be stored in the second memory device.

7. The interface of claim 1, wherein the control logic includes circuitry operable to initialize the second memory device.

8. The interface of claim 1, further comprising data validity logic that determines whether the data is valid prior to the enable logic allowing the data to be written into the second memory device.

9. The interface of claim 8, wherein the data validity logic performs a test to determine that the data is valid, and wherein the test is selected from the group consisting of a cyclic redundancy check, check-bit code test, a parity check, and a checksum test.

10. The interface of claim 1, further comprising a state machine to control the operation of the interface.

11. The interface of claim 1, further comprising data retrieval logic for transferring the data from the second memory device to the first memory device.

12. The interface of claim 1, wherein an energy storage mechanism of the storage element is reversible.

13. An interface for memories having different write times, comprising in combination:

means for monitoring whether a processor accesses a first memory device;

means for capturing data and address information from a memory access;

means for determining whether to store the data associated with the memory access in a second memory device, wherein the second memory device is a hardened latch that includes a logic circuit and a storage element, wherein an amount of energy that can be stored in the storage element is greater than an amount of energy that can be removed by an event upset;

means for determining an address in the second memory device to which the data is to be stored upon determining that the data is to be stored in the second memory device;

means for discarding the data upon determining that the data is not to be stored in the second memory device;

enable logic for writing the data to the second memory device, wherein the enable logic enables the data to be written into the determined address of the second memory device; and one or more stage device means for temporarily storing the data before the data is written to the second memory device to compensate for the difference in write times between the first and second memory devices, wherein the time required to write the data to the second memory device is greater than the time required to write the data to the first memory device.

14. The interface of claim 13, further comprising means for determining when a processing frame has ended.

15. The interface of claim 13, further comprising means for determining that the data is valid prior to the data being written into the second memory device.

16. The interface of claim 13, further comprising means for selecting a particular memory block in the second memory device for writing the data.

17. The interface of claim 13, further comprising means to control the operation of the interface so that writing the data into and reading the data from the second memory device is compatible with substantially real time computations performed by the processor.

18. The interface of claim 13, further comprising means for transferring the data from the second memory device to the first memory device.

19. A method for providing an interface between memory devices having different write speeds, comprising in combination:

monitoring communication between a processor and a first memory device;

when the processor writes data to an address in the first memory device, latching the data and the address;

determining whether the data is to be stored in a second memory device, wherein the second memory device is a hardened latch that includes a logic circuit and a storage element, and wherein an amount of energy that can be stored in the storage element is greater than an amount of energy that can be removed by an event upset;

if the data is to be stored in the second memory device, determining an address for storing the data in the second memory device;

if the data is not to be stored in the second memory device, discarding the data;

writing the data in the determined address of the second memory device; and temporarily storing the data in one or more stage devices before writing the data to the second memory device to compensate for the difference in write times between the first and second memory devices, wherein the time required to write the data to the second memory device is greater than the time required to write the data to the first memory device.

20. The method of claim 19, wherein determining whether the data is to be stored in the second memory device includes comparing the data to a programmable array that identifies what data is to be stored in the second memory device.

21. The method of claim 19, further comprising determining whether a frame has ended prior to the data being written into the second memory device.

22. The method of claim 19, further comprising determining that the data is valid prior to the data being written into the second memory device.

23. The method of claim 19, further comprising initializing the second memory device.

24. The method of claim 19, further comprising transferring the data from the second memory device to the first memory device.

* * * * *